United States Patent
Prendergast et al.

(10) Patent No.: US 9,998,810 B2
(45) Date of Patent: Jun. 12, 2018

(54) PORTABLE SPEAKER SYSTEM FOR ELECTRIC STRING INSTRUMENTS

(71) Applicant: JAMSTACK INC., Toronto (CA)

(72) Inventors: Christopher James Prendergast, Toronto (CA); Dylan Horvath, Toronto (CA); Borys Chylinski, Toronto (CA)

(73) Assignee: JAMSTACK INC., Markham (CA)

( * ) Notice: Subject to any disclaimer, the term of this patent is extended or adjusted under 35 U.S.C. 154(b) by 0 days. days.

(21) Appl. No.: 15/610,978

(22) Filed: Jun. 1, 2017

(65) Prior Publication Data

US 2017/0347173 A1 Nov. 30, 2017

Related U.S. Application Data

(63) Continuation of application No. PCT/IB2017/053186, filed on May 30, 2017.

(60) Provisional application No. 62/411,760, filed on Oct. 24, 2016, provisional application No. 62/343,039, filed on May 30, 2016.

(51) Int. Cl.
*H04R 1/02* (2006.01)
*H03F 3/181* (2006.01)

(52) U.S. Cl.
CPC ............. *H04R 1/026* (2013.01); *H03F 3/181* (2013.01); *H03F 2200/03* (2013.01); *H04R 2201/028* (2013.01); *H04R 2420/07* (2013.01)

(58) Field of Classification Search
CPC ............................ G09B 15/003; G09B 15/02
USPC ...... 84/8, 646, 731, 743, 735, 737; 381/334; 434/307 R; 361/679.56
See application file for complete search history.

(56) References Cited

U.S. PATENT DOCUMENTS

| | | | |
|---|---|---|---|
| 5,121,668 A * | 6/1992 | Segan | G10H 1/342 |
| | | | 84/646 |
| 6,404,893 B2 | 6/2002 | Iori | |
| 6,696,632 B2 * | 2/2004 | Minakuchi | G10H 1/32 |
| | | | 84/735 |
| 9,117,431 B1 | 8/2015 | Rudes | |
| 9,318,080 B1 | 4/2016 | Medeiros | |
| 9,699,539 B2 | 7/2017 | Iori et al. | |
| 2001/0033236 A1 | 10/2001 | Iori et al. | |
| 2007/0227341 A1 | 10/2007 | Iori | |
| 2011/0211713 A1 | 9/2011 | Cavallo-Romano | |

(Continued)

OTHER PUBLICATIONS

International Search Report and Written Opinion dated Sep. 6, 2017, by ISA, re PCT International Patent Application No. PCT/IB2017/053186.

*Primary Examiner* — S Elahee
(74) *Attorney, Agent, or Firm* — Perry + Currier Inc.

(57) ABSTRACT

A portable speaker system for an electric string instrument such as a guitar. The portable speaker system has a housing including an audio jack for receiving a raw audio signal from a guitar, an amplifier, a speaker, and a power supply. The portable speaker system attaches to the guitar by a button connector which releasably attaches to a strap button of the guitar, and a stabilizer for inhibiting rotation of the portable speaker system when attached to the guitar. The portable speaker system portably generates output sound from the raw audio signal. The portable speaker system can couple with a portable computing device, which can process the raw audio signal and provide a supplementary audio signal, from which the portable speaker system can portably generate output sound.

16 Claims, 12 Drawing Sheets

(56) References Cited

U.S. PATENT DOCUMENTS

| | | | |
|---|---|---|---|
| 2014/0355814 A1* | 12/2014 | Grinnip, III | H04R 7/20 |
| | | | 381/398 |
| 2015/0059561 A1* | 3/2015 | Mejia | G10H 1/02 |
| | | | 84/737 |
| 2015/0098184 A1* | 4/2015 | Tsai | G06F 1/1632 |
| | | | 361/679.56 |
| 2015/0195633 A1* | 7/2015 | Elsasser | H04R 1/02 |
| | | | 381/334 |
| 2016/0066074 A1 | 3/2016 | Iori et al. | |
| 2017/0076705 A1 | 3/2017 | Iori et al. | |

* cited by examiner

PORTABLE SPEAKER SYSTEM FOR ELECTRIC STRING INSTRUMENTS

CROSS-REFERENCE TO RELATED APPLICATIONS

This application claims priority to U.S. 62/343,039, filed May 30, 2016, and U.S. 62/411,760, filed Oct. 24, 2016, the entirety of which is incorporated herein by reference.

FIELD

The present invention relates to musical instrument accessories and in particular to a portable speaker system for electric string instruments.

BACKGROUND

Electric string instruments such as electric guitars, electric bass guitars, and the like, are restricted in their portability by the requirement that an amplifier and speaker system is required for generating output sound from the instrument when the instrument is played. Known amplifiers and speaker systems are not easily portable because of their typically large size and their requirement to be connected to an electric power source. Users of electric string instruments have therefore not enjoyed the portability of their acoustic counterparts.

Electric string instruments with built-in speaker systems and power supplies exist, however, do not help the user who wishes to portably use one's own preferred electric string instrument of choice. Retrofitting a preferred electric string instrument of choice with built-in speakers is expensive, burdensome, and drastically alters the instrument. Such drastic alterations are especially not preferred for high-quality collectible instruments. Separate portable speaker units provide some degree of portability to a user, but the user is still tethered to the speaker unit while playing, and is unable to be mobile with the separate speaker unit while playing the instrument.

For users wishing to add supplementary audio or processing to the sound of one's preferred electric string instrument, by means of a portable computing device, the portability challenge is compounded by the requirement of the guitar, the speaker, and the portable computing device to remain connected while playing the instrument.

SUMMARY

According to an aspect of an embodiment, a portable speaker system for an electric string instrument is provided. The portable speaker system includes a housing, which includes an audio jack for receiving an audio plug, the audio plug providing a raw audio signal generated by the electric string instrument when played by a user, an amplifier coupled to the audio jack and configured to receive an audio signal and amplify the audio signal to generate an amplified audio signal, the audio signal comprising one of the raw audio signal and a processed raw audio signal, a speaker coupled to the amplifier and configured to receive the amplified audio signal and generate output sound from the amplified audio signal, and a power supply coupled to the amplifier and speaker for powering the amplifier and speaker. The portable speaker system also includes a button connector disposed on the housing for releasably attaching to a strap button of the electric string instrument to attach the portable speaker system to a body of the electric string instrument, and a stabilizer extending from the attachment module for inhibiting rotation of the portable speaker system when the portable speaker system is attached to the electric string instrument.

The portable speaker system may further include a supplementary audio connection coupled to the amplifier and a portable computing device, the supplementary audio connection for receiving a supplementary audio signal from the portable computing device, wherein the amplifier is configured to receive the audio signal comprising the raw audio signal and the supplementary audio signal.

The portable speaker system may further include a supplementary audio connection coupled to the amplifier and a portable computing device, the supplementary audio connection for forwarding the raw audio signal to the portable computing device for processing, and for receiving the processed raw audio signal from the portable computing device, wherein the audio signal comprises the processed raw audio signal.

The portable speaker system may further include an electrical bypass for selectively providing one of the raw audio signal and the processed raw audio signal to the amplifier.

The portable speaker system may further include a mounting mechanism mount attached to the housing of the portable speaker system, the mounting mechanism including a holder for securely holding, the portable computing device therein.

The mounting mechanism may be detachable from the housing of the portable speaker system.

The mounting mechanism may be integral with the stabilizer, and the stabilizer extends along a portion of the body of the when the portable speaker system is attached to the guitar.

The button connector may be disposed on a bottom of the housing, the stabilizer may be pivotally connected to the housing, the stabilizer may be pivotable between an open position which the stabilizer overlaps a portion of the body of the guitar to inhibit rotation of the portable speaker system when the portable speaker system is attached to the guitar, and a closed position in which the supporting member is adjacent to the housing of the portable speaker system when the portable speaker system is not attached to the guitar.

The stabilizer provides a stand for the portable speaker system when the stabilizer is in its closed position.

The stabilizer may be elastically biased against the portion of the body of the guitar when the portable speaker system is attached to the guitar.

The supplementary audio connection may comprise a wireless audio connection.

According to another aspect of an embodiment, a portable speaker system for a guitar is provided. The system includes a portable computing device, an portable speaker system for the guitar, the portable speaker system including a housing, the housing including an audio jack for receiving an audio plug, the audio plug providing a raw audio signal generated by the guitar, an amplifier coupled to the audio jack and configured to receive an audio signal and amplify the audio signal to generate an amplified audio signal, the audio signal comprising one of the raw audio signal and a processed raw audio signal, a speaker coupled to the amplifier and configured to receive the amplified audio signal and generate output sound from the amplified audio signal, and a power supply coupled to the amplifier and speaker for powering the amplifier and speaker. The portable speaker system includes an attachment mechanism for releasably attaching the portable speaker system to the guitar and for inhibiting rotation of the portable speaker system when the portable speaker system is attached to the guitar, a portable computing device mount extending from the housing of the portable speaker system for securing the portable computing device in fixed relation to the guitar, and a supplementary audio connection coupled to the amplifier and the portable computing device, the supplementary audio connection for forwarding one of the processed raw audio signal and a supplementary audio signal to the amplifier.

The supplementary audio connection may be configured to receive a supplementary audio signal generated by the portable computing device and wherein the audio signal comprises the raw audio signal and the supplementary audio signal.

The supplementary audio connection may be configured to forward the raw audio signal to the portable computing device for processing and to receive the processed raw audio signal from the portable computing device, and wherein the audio signal comprises the processed raw audio signal.

The portable speaker system may include a button connector on the housing for releasably attaching to a strap button of the guitar to attach the portable speaker system to a body of the guitar, and a supporting member extending from the portable speaker system for inhibiting rotation of the portable speaker system when the portable speaker system is attached to the guitar.

BRIEF DESCRIPTION OF THE DRAWINGS

Non-limiting embodiments of the present invention will now be described, by way of example only, with reference to the attached Figures, wherein.

DETAILED DESCRIPTION

Figure 1:
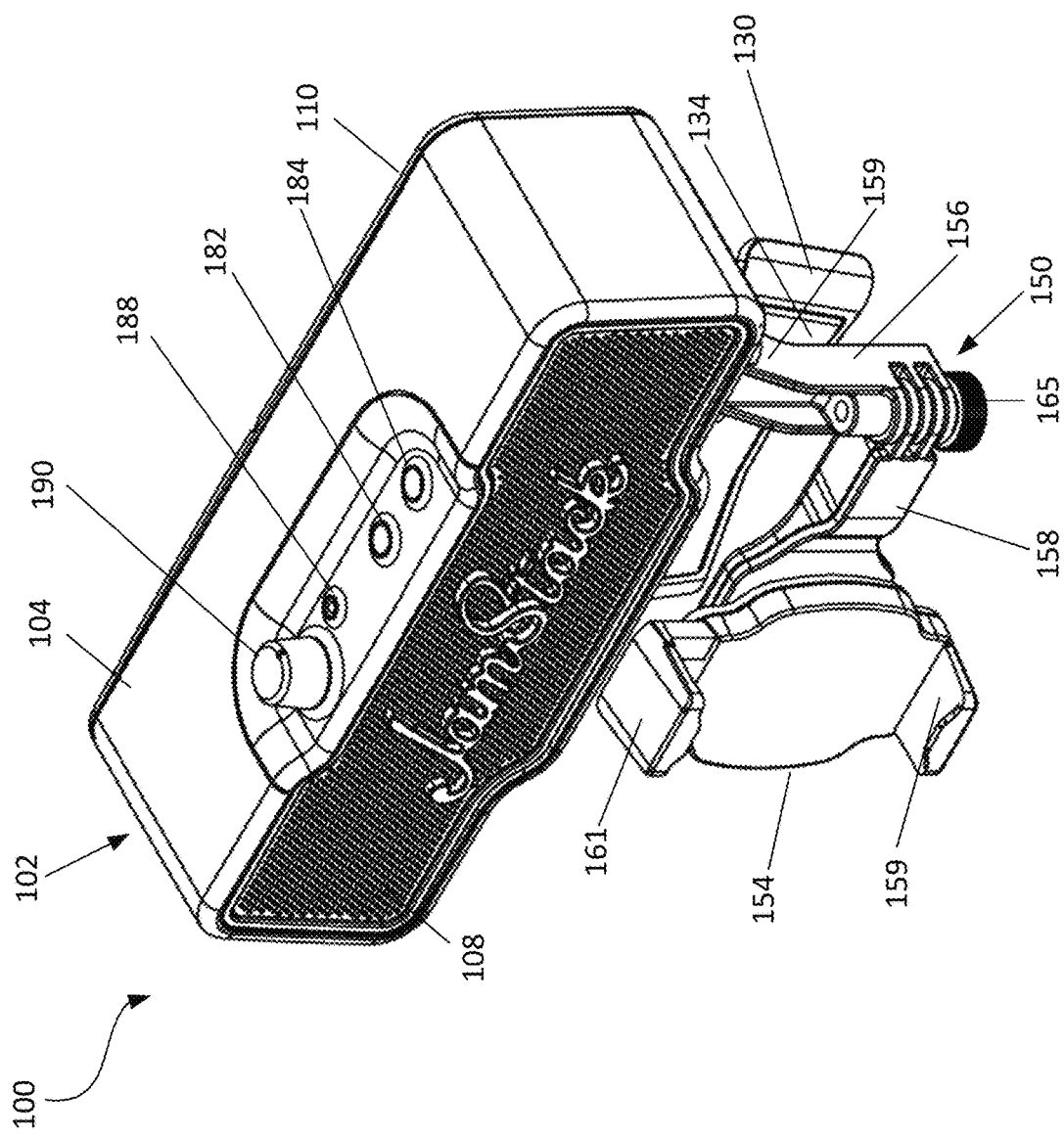
FIG. 1 is a front perspective view of a portable speaker system for attachment an electric string instrument in accordance with an embodiment.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

The present disclosure generally relates to a portable speaker system for attachment to a body of an electric string instrument, such as for example, an electric guitar (hereinafter referred to simply as a guitar) without interfering with the ability of a user to play the electric string instrument. The portable speaker system can be connected to an output plug of the electrical string instrument using, for example, an audio cable, to receive raw audio signals from the electric string instrument to the portable speaker system when the electric string instrument is played. The portable speaker system also includes an amplifier configured to amplify raw audio signals received from the electric string instrument when the electric string instrument is played by a user, and one or more speakers configured to receive the amplified audio signals and generate sound from the amplified audio signals.

The portable speaker system may also include a mount for a portable computing device for receiving raw audio signals from the portable speaker system, and for optionally providing supplemental audio to the portable speaker system that can be combined with the raw audio signals received from the electric string instrument when played. The portable speaker system may also be connected to the portable computing device, using for example, an electrical cable, to route raw audio signals received from the electric string instrument when played to the portable computing device. The portable computing device processes the raw audio signals or modulates the raw audio signals to add supplementary audio the raw audio signals and transmits the processed raw audio signals, or the modulated to the portable speaker for amplification by the amplifier and generating sound using the one or more speakers.

Figure 6:
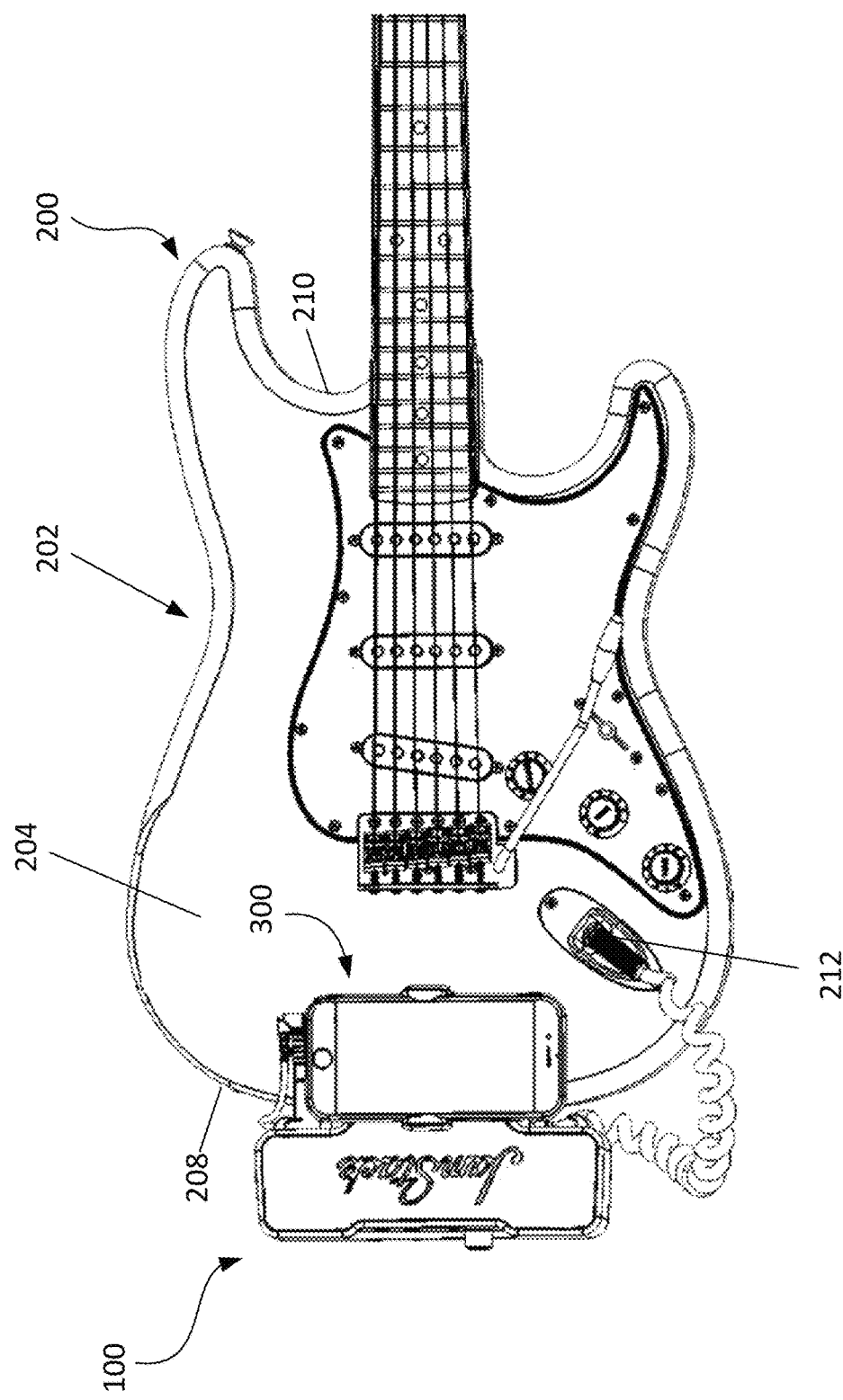
FIG. 6 is a front view of the portable speaker system of FIG. 1 attached to a guitar and coupled with a portable computing device, according to a non-limiting embodiment.
Figure 7:
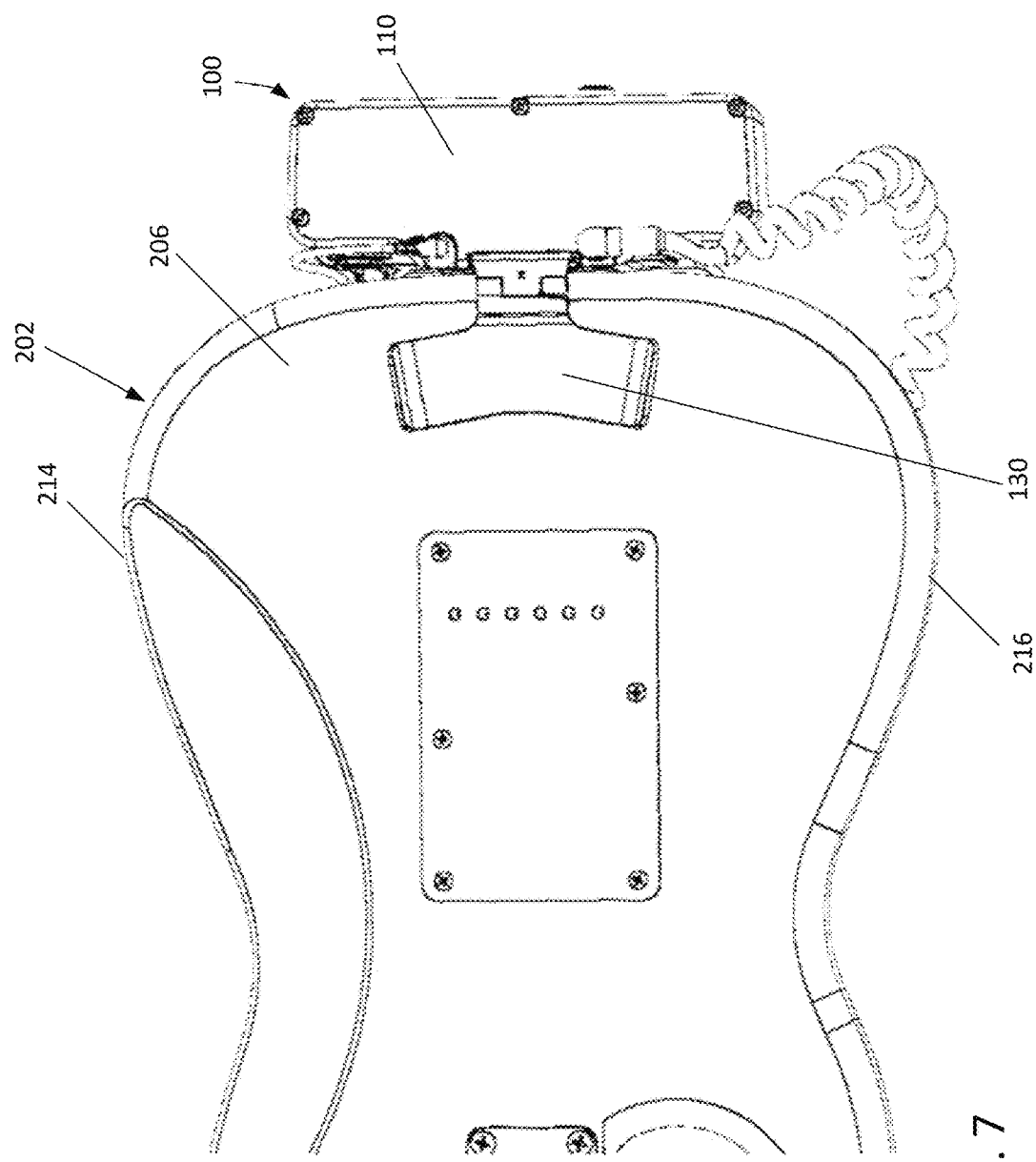
FIG. 7 is a partial rear view of the portable speaker system of FIG. 1, attached to the guitar shown in FIG. 6 and coupled with the portable computing device shown in FIG. 6.

FIGS. 1 to 5 show an example embodiment of a portable speaker system 100 for attachment to an electrical string instrument. In the following description, the portable speaker system 100 (referred to hereinafter as system 100) is attachable to an electric guitar 200 (referred to hereinafter as guitar 200) as shown in FIGS. 6 and 7. The system 100, however, may be attachable to and used with any suitable electric string instrument, such as for example, an electric bass guitar, a hybrid electric-acoustic guitar, an electric ukulele, and the like.

Figure 12:
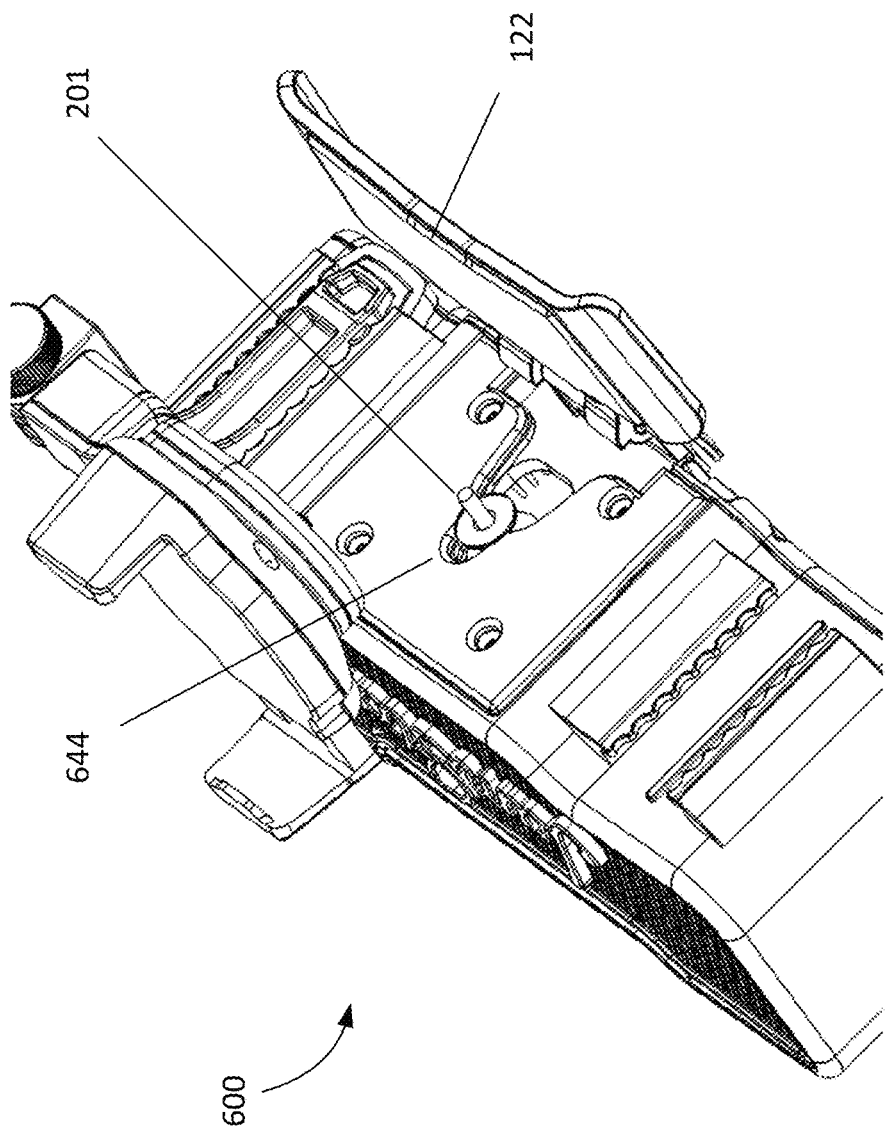
FIG. 12 is a partial perspective view of the portable speaker system of FIG. 11 having a strap button from a guitar inserted therein.

The system 100 includes a housing 102 having a top 104, a bottom 106, a front 108, and a back 110. The bottom 106 of the housing 102 includes a guitar attachment portion 112 comprising a guitar attachment mechanism 114 for releasably attaching the system 100 to a body 202 of the guitar 200. In the embodiment shown in FIG. 1 to FIG. 5, the guitar attachment mechanism 114 is a button connector that includes a recess 116 shaped and sized to receive and retain a strap button 201 of the guitar 200 therein. The strap button 201 has a shaft 203 and a flange 205, as shown in FIG. 12. The recess 116 is key-shaped and includes an enlarged portion 118 having a first diameter, and a narrow portion 120 having a second diameter that is less than the first diameter of the enlarged portion 118. The diameter of the enlarged portion 118 of the recess 116 is greater than a diameter of the flange 205 of the strap button 201 so that the strap button 201 passes through the enlarged portion 118 of the recess 116.

The diameter of the narrow portion 120 of the recess 116 is less than the diameter of the flange 205 of the strap button 201. The narrow portion 120 of the recess 116 is shaped and size to engage with the shaft 203 of the strap button 201 to securely attach the housing 102 of the system 100 to the guitar 200.

The system 100 also includes a stabilizer 122 for inhibiting rotation of the system 100 when the system 100 is attached to the guitar 200 as described in further detail below. In the embodiment shown in FIG. 1 to FIG. 5, the stabilizer 122 includes a base 126, a spring hinge 128, and a plate 130. The base 126 is coupled to the bottom 106 of the housing 102 proximate the back 110 of the housing 102 and extends away from the bottom 106 of the housing 102. The plate 130 is pivotally connected to the base 126 by the spring hinge 128. The plate 130 of the stabilizer 122 pivots between an open position (FIG. 3) in which the plate 130 extends away from the bottom of the housing 102 substantially perpendicular to the bottom 106 of the housing 102, and a closed position (FIG. 4) in which the plate 130 is adjacent to the guitar attachment portion 112 and a front surface 132 of the plate 130 faces the guitar attachment portion 112. The spring hinge 128 provides a spring force that biases the plate 130 into the closed position.

In some embodiments, when the plate 130 is in the closed position, the front surface 132 of the plate 130 is spaced from the guitar attachment portion 112. In alternative embodiments, when the plate 130 is in the closed position, the front surface 132 of the plate 130 abuts or rests against the guitar attachment portion 112. Also, in some embodiments, when the plate 130 is in the closed position, the plate 130 covers the recess 116 in the guitar attachment portion 112.

In some embodiments, the plate 130 includes a compressible soft material 134, such as for example, rubber for engaging with the body 202 (FIG. 6) of the guitar 200 and for protecting the body 202 of the guitar 200 from scratching when the system 100 is attached to the guitar 200. The compressible soft material 134 is mounted on the front face of the plate 130 and may be any suitable material that protects the body 202 of the guitar 200 from scratching, such as, for example, rubber.

Referring again to FIG. 1 to FIG. 5, the system 100 also includes a mounting mechanism 150 for attaching a portable computing device 300 (FIG. 7) to the system 100. The mounting mechanism 150 is attachable to the bottom 106 of the housing 102 of the system 100 and detachable therefrom as described in further detail below. The mounting mechanism 150 includes an articulating arm 152 and a holder 154. The articulating arm 152 includes a fixed portion 156 and a rotating portion 158 that is coupled to the fixed portion 156 and rotates about an axis that extends along the fixed portion 156 to adjust a position of the holder 154 of the mounting mechanism 150 relative to the housing 102 of the system 100.

The holder 154 is coupled to the rotating portion 158 of the articulating arm 152. The holder 154 is shaped and dimensioned to receive and securely retain the portable computing device 300 therein. The holder 154 includes a fixed end 159 and a gripper 161 for securing retaining the portable computing device 300 in the holder 154. The gripper 161 is moveable relative to the fixed end 159 to adjust a distance between the fixed end 159 and the gripper 161 to enable portable computing devices of varying size to be inserted into the holder 154 and to securely retained therein. The gripper 161 can be spring-loaded to apply a force against an edge of a portable computing device 300 when the portable computing device 300 is interested into the holder 154 to securely retain the portable computing device 300 in the holder 154.

The articulating arm 152 also including a locking mechanism 165 for locking the rotating portion 158 to the fixed portion 156 when the holder 154 is in a desired position relative to the housing 102 of the system 100. The locking mechanism 165 may be any suitable locking mechanism, such as for example, a thumb screw that applies friction to lock the rotating portion 158 to the fixed portion 156.

Figure 2:
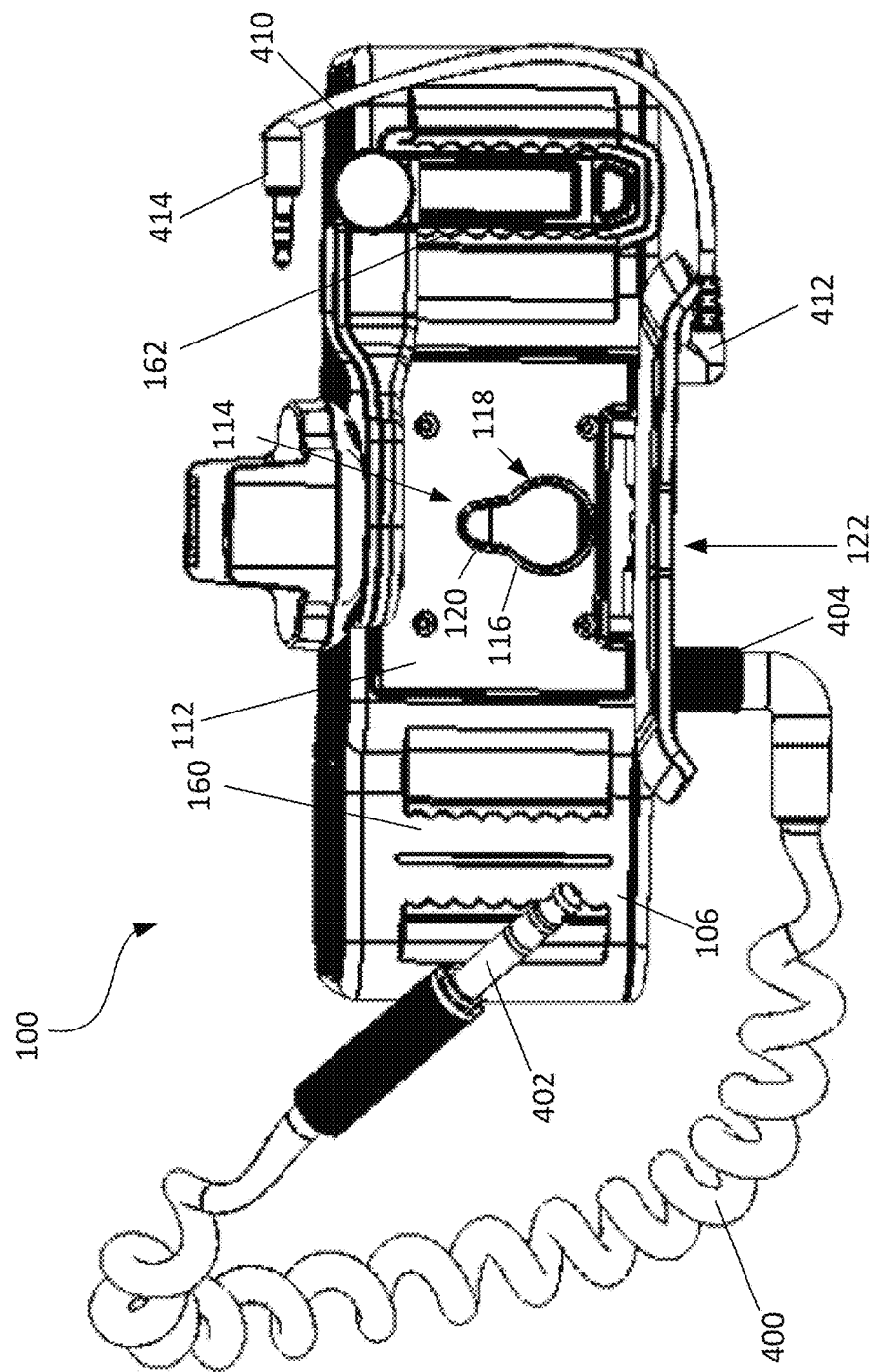
FIG. 2 is a bottom view of the portable speaker system of FIG. 1.
Figure 3:
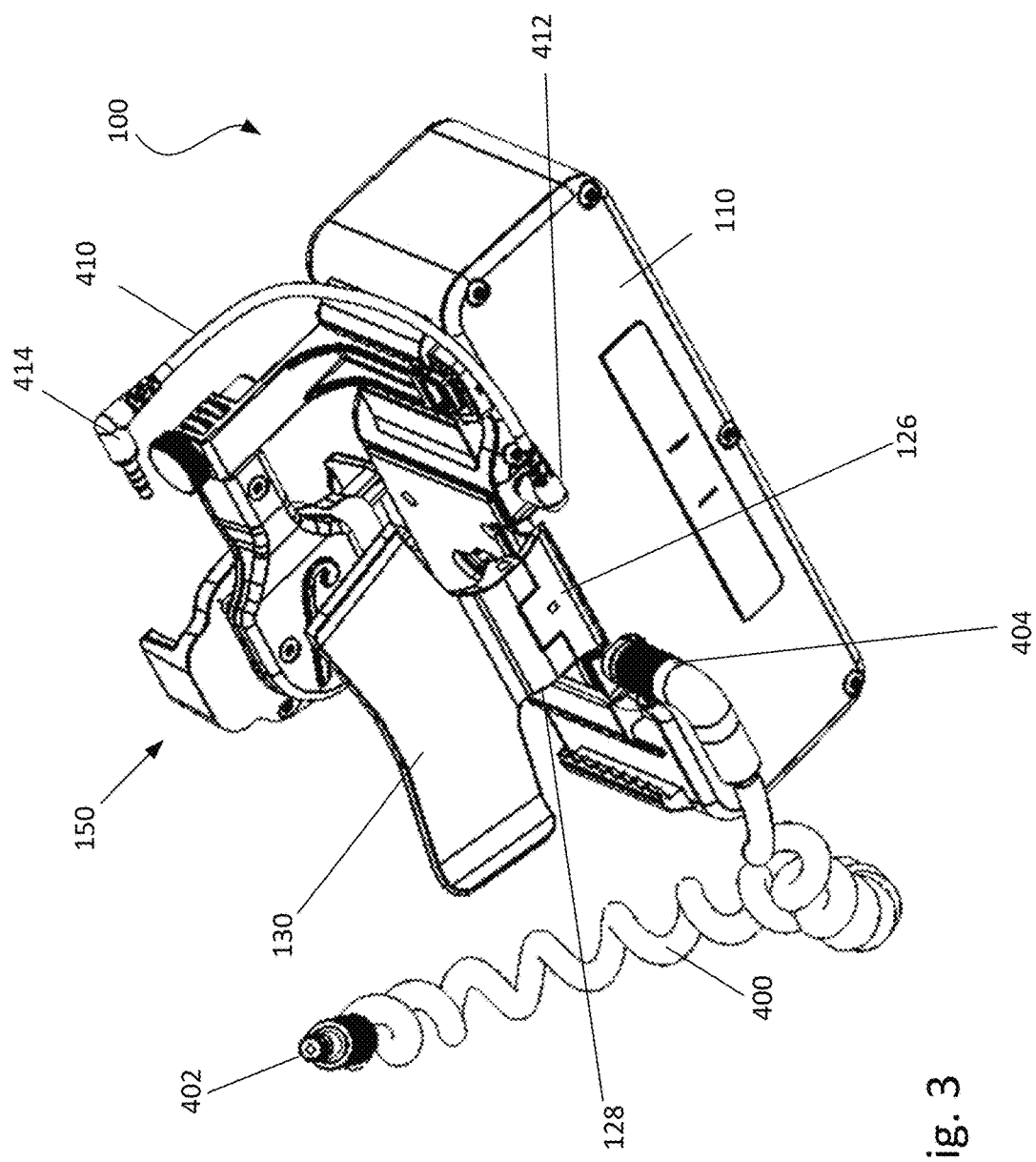
FIG. 3 is a rear perspective view of the portable speaker system of FIG. 1.
Figure 4:
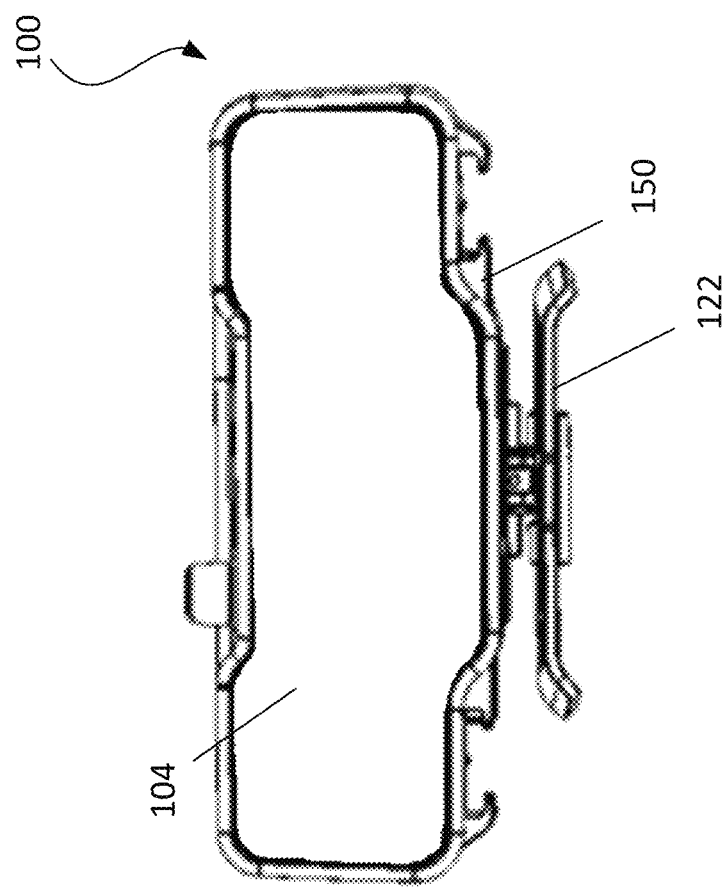
FIG. 4 is a top view of the portable speaker system of FIG. 1.

As mentioned above, the mounting mechanism 150 is attachable to and detachable from the housing 102. Referring to FIG. 2, the bottom 106 of the housing 102 includes a first mounting slot 160 and a second mounting slot 162. The first mounting slot 160 is shaped and dimensioned to receive a first end 164 of the fixed portion 156 of the articulating arm 152 and to attach the mounting mechanism 150 to the housing 102.

In FIG. 2, the mounting mechanism 150 is shown inserted into the second mounting slot 162 which, on right-handed guitars, is closer to a user when the system 100 is attached to the guitar 200 and the guitar 200 is being played by a user. Thus, when the first end 164 of the fixed portion 156 of the mounting mechanism 150 is attached to the second mounting slot 162. In the present embodiment, the mounting mechanism 150 can be detached from the second mounting slot 162 by disengaging the first end 164 of the fixed portion 156 from the second mounting slot 162 and inserting the first end 164 of the fixed portion 156 into the first mounting slot 160. The first mounting slot 160 and the second mounting slot 162 enable a user to adjust a position of the mounting mechanism 150 on the system 100 so that when the system 100 is attached to the guitar 200, the holder 154 can positioned over the body 202 of the guitar 200 so as to not interfere with the user's ability to play the guitar 200.

The system 100 also includes an audio port 166 disposed on the bottom 106 of the housing 102 for electrically coupling the system 100 to the guitar 200 as described in further detail below. The system 100 also includes a supplemental audio port 168 for electrically coupling the system 100 to the portable electronic device 300 as described in further detail below.

Figure 5:
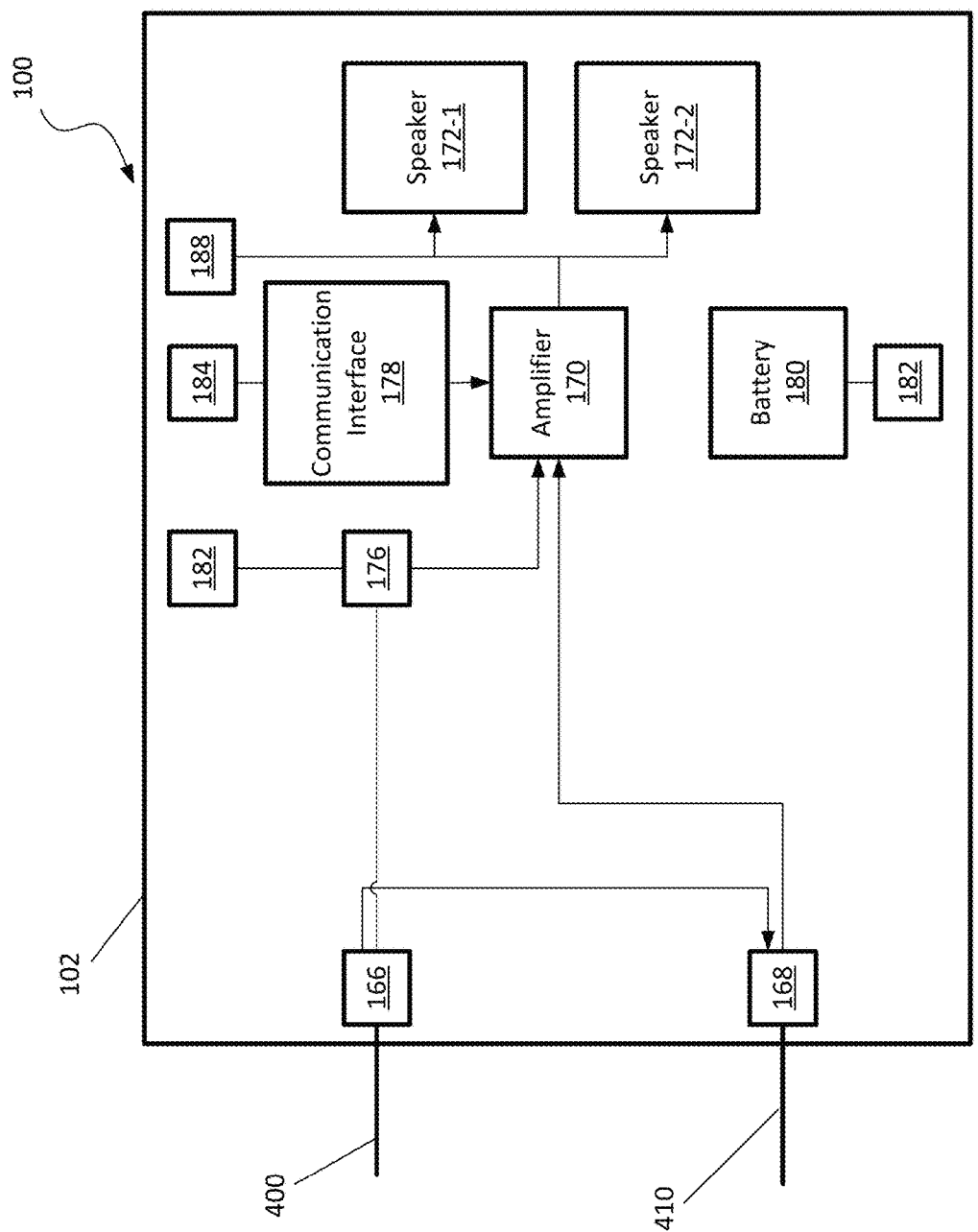
FIG. 5 is a schematic diagram of the portable speaker system of FIG. 1.

Referring to FIG. 5, the system 100 also includes multiple internal components that are disposed in the housing 102, including an amplifier 170, speakers 172-1, 172-2 (referred to generically hereinafter as speaker 172 and collectively as speakers 172), an electrical bypass 176, a communication interface 178, and a battery 180.

The electrical bypass 176 is coupled to a bypass switch 182, the audio port 166 and a bypass switch 182. The amplifier 170 is also coupled to supplemental audio port 168, and the speakers 172. The amplifier is configured to receive audio signals and amplify the audio signals as described in further detail below. The speakers 172 are configured to receive amplified audio signals from the amplifier 170 and generate output sound from the amplified audio signals as described in further detail below.

The communication interface 178 is coupled to a communication interface switch 184 and amplifier 170. The battery 180 is coupled to the amplifier 170, the speakers 172, and the communication interface 178 to supply power to these components of the system 100. The battery 180 can be a rechargeable battery and is coupled to a charging port 186 for attachment to an external power supply for charging the battery 180. The charging port 186 can be a universal serial bus (USB) charging port or any other suitable charging port for supplying power to the battery 180. Optionally, the system 100 may include a power indicator light (not shown), for displaying a power level of the battery 180.

Reference is now made to FIG. 6 and FIG. 7 to describe the attachment of the system 100 to the guitar 200. As shown in FIG. 6 and FIG. 7, the guitar 200 includes a body 202 that has a curved shaped. The body 202 includes a front surface 204, a back surface 206 (FIG. 7), a first end 208, a second end 210, and an audio output port 212 into which a first audio plug 402 of an audio cable 400 can be inserted into. The audio cable 400 also includes a second audio plug 404 for insertion into the audio port 166 of the system 100 (see FIG. 3) to electrically couple the system 100 to the guitar 200. A supplemental audio cable 410 that includes a first audio plug 412 for insertion into the supplemental audio port 168 of the system 100 and a second audio plug 414 for insertion into an audio port 302 of the portable computing device 300 to electrically couple the system 100 to the portable computing device 300.

To accommodate a wide variety of shapes and contours in the body 202, the system 100 attaches to the guitar 200 via a strap button 201 (FIG. 12) of the guitar 200. The system 100 can be attached to guitars of various sizes and shapes. To attach the system 100 to the guitar 200, the plate 130 of the stabilizer 122 is pivoted to the open position such that the front surface 132 of the plate 130 is generally parallel with the back 110 of the housing 102. The first end 208 of the guitar 200 is inserted between the front surface 132 of the stabilizer 122 and the mounting mechanism 150 such that the stabilizer 122 rests against the back surface 206 of the guitar 200 and the articulating arm 152 of the mounting mechanism 150 is adjacent to the front surface 204 of the guitar 200. The strap button 201, which is disposed on the first end 208 of the guitar 200, is inserted into the enlarged portion 118 of the recess 116 and the shaft 203 of the snap button 203 is slid into the narrow portion 120 of the recess 116 to engage therewith. With the strap button 201 engaged with the narrow portion 120 of the recess 116, and the plate 130 of the stabilizer 122 extending along and biased against the back surface 206 of the guitar 200, the system 100 is attached to the guitar 200 and inhibited from rotation about the strap button 201. The shape of the recess 116 inhibits the shaft 203 of the strap button 201 from slipping out of the narrow portion 120 of the recess 116. Also, the stabilizer 122, when resting against the back surface 206 of the guitar 200, inhibits rotation of the system 100 because the plate 130 abuts the back surface 206 of the guitar 200 when the system 100 rotates about the strap button 201. The system 100 can be attached to the guitar 200 using one hand with the other hand holding the guitar 200.

The system 100 can be detached from the guitar 200 by angling the guitar 200 relative to the system 100 such that the strap button 201 is withdrawn from the enlarged portion 118 of the recess 116. The plate 130 of the stabilizer 122 can then be pivoted into the closed position for compact storage or to be used as a stand. It will be appreciated that the shape of the housing 102 enables the system 100 to be attachable to a wide variety of electric string instruments of different shapes and sizes.

The operation of the system 100 will now be described in detail. When the guitar 200 is played by a user, the guitar 200 generates raw audio signals that are output on the audio output port 212 of the guitar 200, transmitted to the system 100 over the audio cable 400, and received at the system 100 at the audio port 166. In the present embodiment, the system 100 can be configured to operate in three different configurations: raw configuration, wired configuration, and wireless configuration.

In the raw configuration, raw audio signals generated by guitar 200 are received at audio port 166 via the audio cable 400 when the guitar 200 is played. The raw audio signal passes through the electrical bypass 176, which allows raw audio signals to pass directly to the amplifier 170. The raw audio signals are amplified by the amplifier 170. The amplified raw audio signals are received by the speaker 172 which generate output sound from the amplified raw audio signals. In raw configuration, the system 100 operates without an electrical connection to the portable computing device 300 to produce a clean unaltered sound from the guitar 200. Raw configuration can be activated by actuation of the bypass switch 182, which configures the electrical bypass to route the raw audio signals directly to the amplifier 170. In the raw configuration, the raw audio signals generated by the guitar when played are amplified and output without the need for the portable computing device 300.

In wired configuration, raw audio signals are generated by guitar 200 are received at audio port 166 via the audio cable 400 when the guitar 200 is played. In wired configuration, electrical bypass 176 routes the raw audio signals to the supplemental audio port 168 for transmission to the portable computing device 300. The portable computing device 300 receives the raw audio signals at the audio port 302. The portable computing device 300 can execute an audio processing application to process, modulate, or otherwise modified the raw audio signals by executing instructions of an audio processing application running on the portable computing device 300. For example, instructions of the audio processing application running on the portable computing device 300 may add supplementary audio stored in the portable computing device 300, such as a background drum beat or support instrumentals to the raw audio signals to form processed raw audio signals. The processed raw audio signals are then transmitted from the portable computing device 300 and received at the supplemental audio port 168 and provided to the amplifier 170. The processed raw audio signals are amplified by the amplifier into amplified audio signals, which are then routed to the speakers 172 to generate output sound. The portable computing device 300 can record and store in memory the raw audio signals received from the system 100.

In wireless configuration, a raw audio signal generated by guitar 200 when the guitar is played is received at audio jack 138. The communication interface 178 establishes a wireless connection with the portable computing device 300, which serves as a supplementary audio connection comprising a wireless audio connection. A supplementary audio signal is generated by the portable computing device 300 and received by communication interface 178. The raw audio signal received from the guitar 200 and the supplementary audio signal received from the portable computing device 300 are then combined into the processed raw audio signal, and amplified by the amplifier 170 into an amplified audio signal, which is then provided to the speakers 172 to generate output sound. In some embodiments in which the communication interface 178 comprises a Bluetooth® module, wireless configuration can be reversibly activated by use of the communication interface switch 184, which when actuated, establishes a Bluetooth® connection. However, in some embodiments, the Bluetooth® pairing could take place automatically when a paired device is nearby, obviating the need for the communication interface switch 184.

The system 100 also includes a headphone port 188 disposed on the top 104 of the housing 102. Audio signals output from the amplifier 170 can be routed to the headphone port 188 instead of speakers 172, thereby allowing a user to listen to the output sound for quiet operation The portable computing device 300 can be any suitable portable electronic computing device having audio input and output capability and having an input device such as a touch screen for user interaction with the portable computing device 300, running an audio processing application or software for processing raw audio signal received from the system 100 and/or for supplying supplementary audio signals to the system 100 via the supplemental audio cable 410 and the supplemental audio port 168. In addition to sound processing, the portable computing device 300 can also run an application or software that assists a user in playing the instrument, such as, for example, software that displays, on the touchscreen display of the portable computing device, tabulature or musical notation of the song being played. The portable computing device 300 may be a smartphone running an operating system such as, for example, Android®, iPhone®, Windows® mobile, BB 10, or a suitably sized tablet, a personal digital assistant (PDA), and the like.

Although in the embodiment shown in FIG. 6 and FIG. 7, the portable computing device 300 is shown as being electrically coupled to the system 100 using the supplemental audio cable 410, specifically a one-eighth inch audio cable as is commonly used by portable computing devices, the portable computing device 300 can also be connected to the system 100 through other wired means such as USB, or through a wireless connection, such as a Bluetooth® connection, Wi-Fi connection, or other suitable means for transfer of audio signals.

Although in the embodiment shown in FIG. 6 and FIG. 7, the guitar 200 is shown as being electrically coupled to the portable speaker system 100 using the audio cable 400, specifically a one-fourth inch audio cable as is commonly used in electric guitars and electric bass guitars, it is contemplated that other means for transferring raw audio signals from the guitar 200 to the system 100 may be employed and made compatible with the system 100.

In some embodiments, the front 108 includes a speaker grill which covers the front 106 of the housing 102. The speaker grill can include 108 a brand logo or other message viewable to an audience when the system 100 is attached to the guitar 200.

Referring again to FIG. 1 to FIG. 5, the system 100 also includes a volume control knob 190 for controlling a volume of sound generated by the system 100 and for serving as an on/off switch for the system 100.

In other embodiments, the housing 102 and the guitar attachment portion 112 of the portable speaker system 100 are shaped to conform around an upper strap button (not shown) positioned near an upper edge 214 of the guitar 200. However, given the contours of conventional guitar around this upper strap button, the system 100 be shaped to conform to the less angular contours of the body 202 of the guitar 200 near the strap button 201 at a lower edge 216 of the guitar 200. In the present embodiment, therefore, the housing 102 is generally shaped as a rectangular prism. However, in other embodiments, whether connecting to the strap button 201 or another strap button, the shape of the housing 102 may be any other suitable shape, provided the shape is compatible with the contours of the body 202 of the guitar 200 around the strap button to which the portable speaker system 100 is attached.

In addition to the embodiments shown in the Figures, other guitar attachment mechanisms 114 having button connectors such as clasps and sockets are contemplated, and other stabilizers such as support rods, brackets, and grips, are contemplated. In some embodiments, the stabilizer may not be engaged against the body of the guitar, such as, for example, in the case of a thumb screw or other means for impinging on the strap button to inhibit rotation of the portable speaker system.

Figure 8:
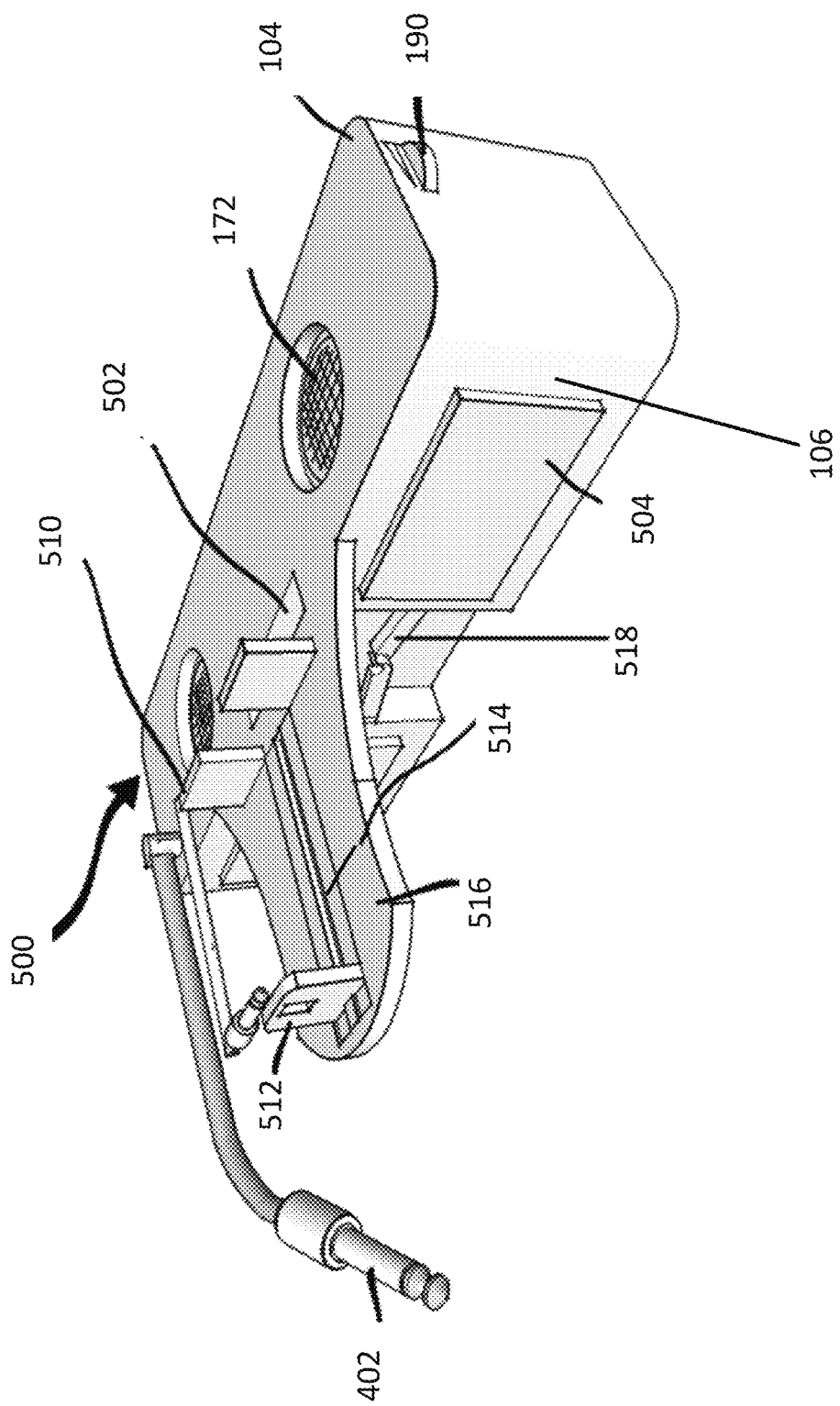
FIG. 8 is a perspective view of the portable speaker system of FIG. 7.
Figure 9:
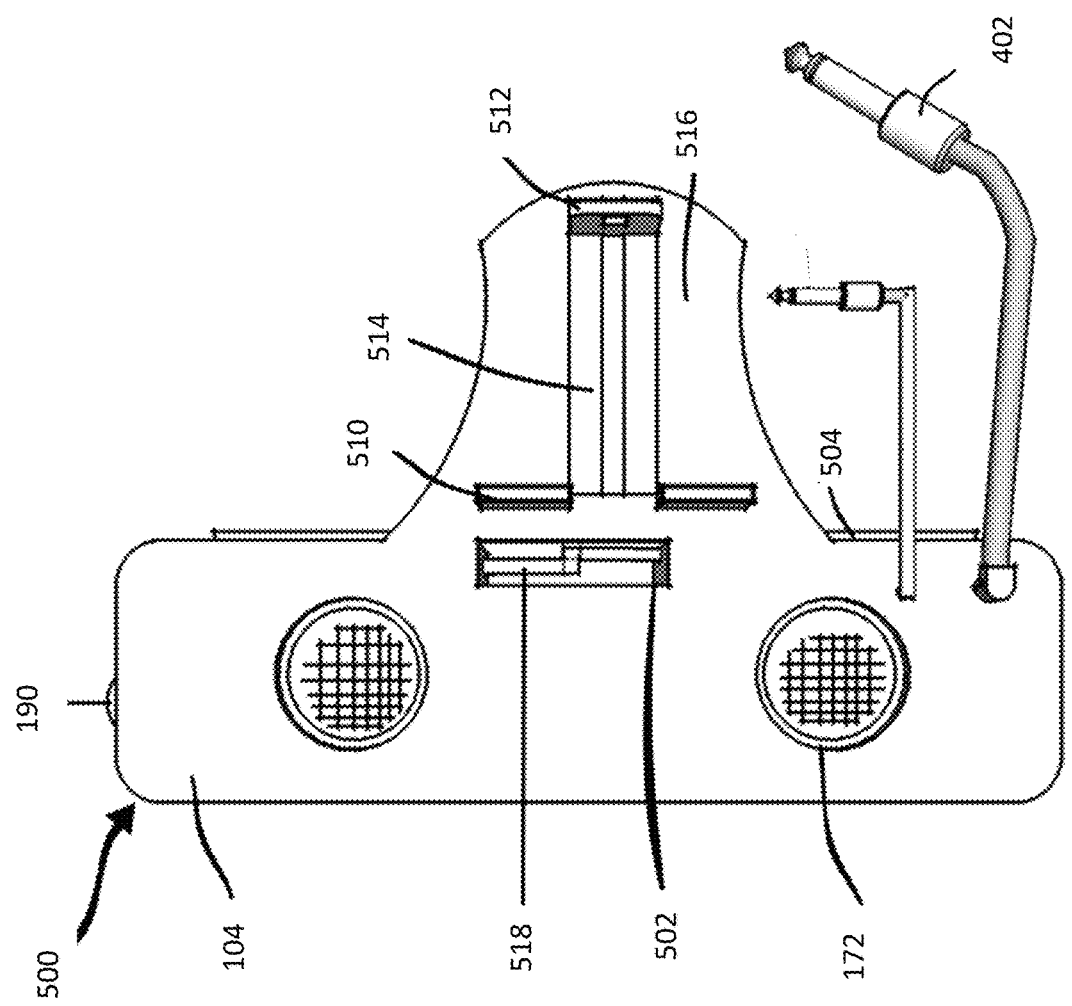
FIG. 9 is a top plan view of a portable speaker system in accordance with another embodiment.
Figure 10:
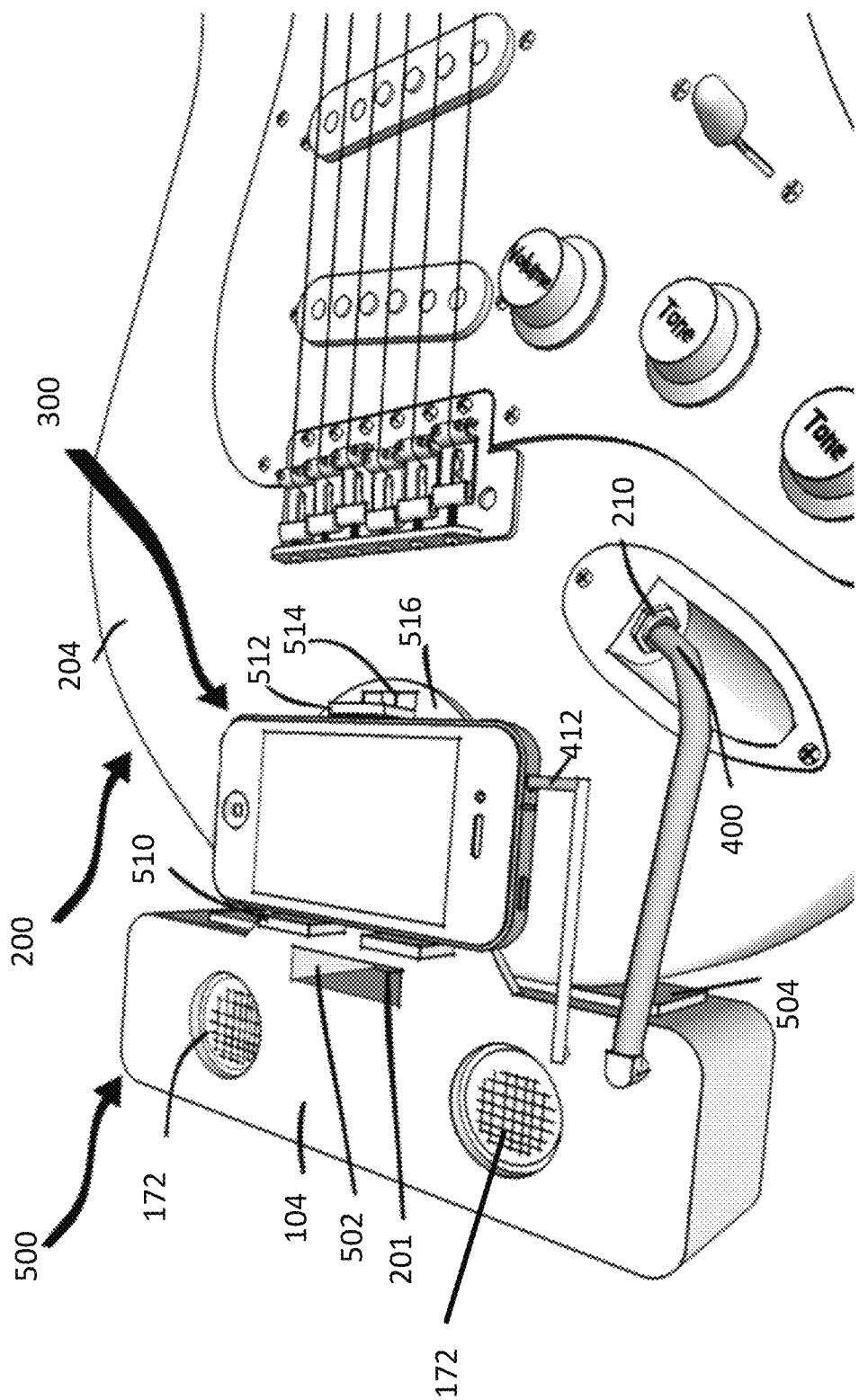
FIG. 10 is a partial perspective view of another embodiment of a portable speaker system attached to a guitar and coupled with a portable computing device.

Referring now to FIGS. 8 to 10, another example embodiment of a portable speaker system 500 is shown. In the description below, reference numerals which are in common with those used with respect to the portable speaker system 100, are considered to refer to elements which are the same as those described in those embodiments.

In the embodiment shown in FIG. 8 to FIG. 10, the portable speaker system 500 includes an integrated stabilizer and portable computing device holder 516 (hereinafter referred to as holder 516). The holder 516 extends away from the bottom 106 of the housing 102 and is integral with the top 104 of the housing 102 of the portable speaker system 500.

The holder 516 comprises base plates 510, a slideable tab 512, and track 514. Between the base plates 510 and the slideable tab 512 is a space for inserting the portable computing device 300. A distance between the slideable tab 512 and base plates 510 is adjustable by moving the slideable tab 512 along the track 514 to enable variously sized portable computing devices 300 to be inserted into the holder 516. The slideable tab 512 slides along the track 514, and is biased by a biasing means, such as a spring, toward the base plates 510, such that when the portable computing device 300 is inserted between the slideable tab 512, the slideable tab 512 applies a force against edges of the portable computing device 300 when the portable computing device 300 is inserted in the space therebetween. In use, the holder 516 inhibits rotation of the portable speaker system 500 when the portable speaker system 500 is attached to the guitar 200 while simultaneously providing a mounting mechanism for attaching a portable computing device.

The portable speaker system 500 also includes locking arms 518 disposed within recess 502 for attaching to a strap button 201 of a guitar 200. The locking arms 518 provide a variation of button connector 140 for releasably attaching with strap button 201 of the guitar 200 to attach the portable speaker system 500 to the guitar 200.

The holder 516 extends along a portion of the body 202 of the guitar 200, in this case the front surface 204 of the guitar 200, generally in parallel with the front surface 204 of the guitar, when the portable speaker system 500 is attached to the guitar 200. The holder 516 inhibits rotation of the portable speaker system 500 when the portable speaker system 500 is attached to the guitar 200 because the holder 516 abuts the front surface 204 of the guitar 200 when the portable speaker system 500 rotates about the strap button 201.

The portable speaker system 500 further comprises padding 504 situated on the bottom 106 of the housing 102 to cushion contact of the portable speaker system 500 against the guitar 200 when the portable speaker system 500 is attached to the guitar 200. The padding 504 can be made of suitably soft material, such as rubber, for protecting the guitar 200 from scratching when the portable speaker system 500 is attached to the guitar 200.

Figure 11:
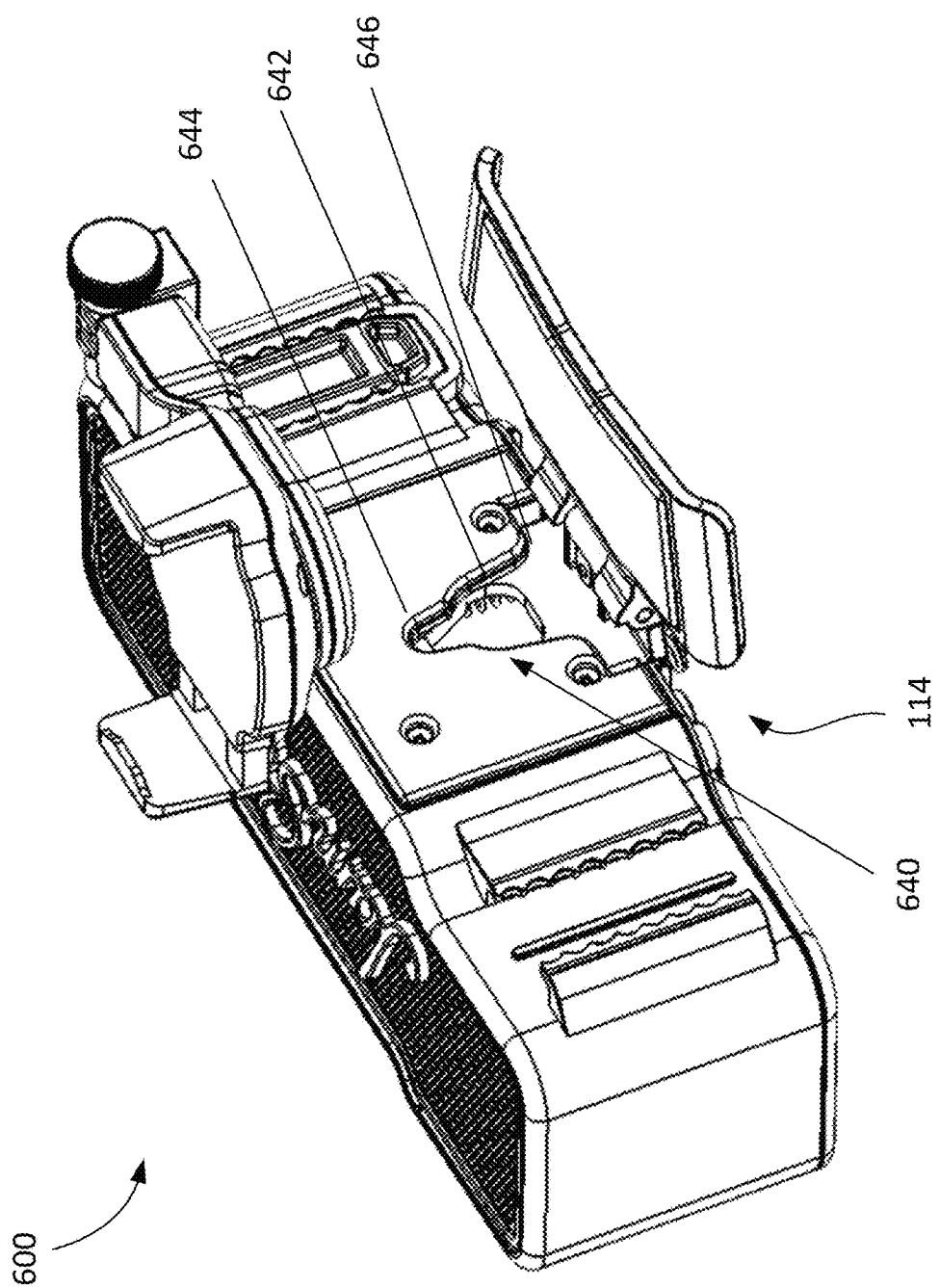
FIG. 11 is a perspective view of another embodiment of a portable speaker system.

FIGS. 11 and 12 showing another example embodiment of the portable speaker system 600. In the description below, reference numerals which are in common with those used with respect to the portable speaker system 100 are considered to refer to elements which are the same or similar to those described in those embodiments.

The portable speaker system 600 comprises a guitar attachment mechanism 114 that includes a button connector 640 which releasably attaches with strap button 201 of the guitar 200 in a similar manner as described above. In the present embodiment, the button connector 640 comprises enlarged portion 642 and a narrowed portion 644. The button connector 640 further comprises a flared portion 646 for accommodating larger sizes of strap buttons 201, and for ease of insertion of the strap button 201 into the enlarged portion 642. FIG. 12 illustrates a strap button 201 (with the guitar 200 omitted) received within the narrowed portion 644.

It will be understood by the person skilled in the art that variations to the embodiments described herein may be made without departing from the scope of the invention. For example, a single speaker may be used instead of two, modifications to the shape of the housing 102 may be made, modifications to the design of the mounting mechanism 150 for holding the portable computing device 300 may be made, the communication interface switch 184 may be omitted in place of an automated wireless connection, different elastic biasing means other than springs may be employed, and different kinds of buttons, switches, ports, jacks, and peripherals of the portable speaker system may be employed. Furthermore, it is understood that circuitry in the portable speaker system has been omitted for brevity, and that circuitry may be inferred to provide the functionality described herein, for example, the functionality of the volume control knob 190 to control volume and the on/off state of the portable speaker system 100, and the circuitry of the electrical bypass 176, and the audio signal pathways.

It is further contemplated that, in other embodiments of the system 100, other guitar attachment mechanisms 114 may be employed which attach the system 100 directly to body 202 of the guitar 200 without attaching with a strap button 201, such as by being clamped to the body 202 of the guitar 200, or the neck of the guitar 200, provided that the attachment mechanism releasably attaches the system 100 to the guitar 200 without interfering with a user's ability to play the guitar and inhibits rotation of system 100 when the system 100 is attached to the guitar 200.

The portable speaker system 100, 500, 600 of the present disclosure is attachable to an electric string instrument allowing the instrument to be played without being tethered to an amplifier and speaker. A portable computing device 300 can be coupled with the portable speaker system 100, 500, 600 for processing raw audio signals received from a guitar 200 when played and for providing supplemental audio. The portable speaker system 100, 500, 600 of the present disclosure enables a user to attach the portable speaker system to an electric string instrument of their choice and a portable computing device, and portably play the electric string instrument, and have the raw audio signal from the guitar processed, modulated, or have supplementary audio added by the portable computing device, for output through the speakers.

The scope of the claims should not be limited by the embodiments set forth in the above examples, but should be given the broadest interpretation consistent with the description as a whole.

The invention claimed is:

1. A portable speaker system for attachment to an electric string instrument, the portable speaker system comprising:
a housing comprising:
an audio jack for receiving an audio plug, the audio plug providing a raw audio signal generated by the electric string instrument;
an amplifier coupled to the audio jack and configured to receive an audio signal and amplify the audio signal to generate an amplified audio signal, the audio signal comprising one of the raw audio signal and a processed raw audio signal;
a speaker coupled to the amplifier and configured to receive the amplified audio signal and generate output sound from the amplified audio signal; and
a power supply coupled to the amplifier and speaker for powering the amplifier and speaker;
a button connector disposed on the housing, the button connector configured to receive a strap button of the electric string instrument, the strap button extending outward from a body of the electric string instrument, to attach the portable speaker system to the body of the electric string instrument; and
a stabilizer extending from the housing for inhibiting rotation of the portable speaker system when the portable speaker system is attached to the electric string instrument.

2. The portable speaker system of claim 1, further comprising a supplementary audio connection configured to be coupled to the amplifier and a portable computing device, the supplementary audio connection for receiving a supplementary audio signal from the portable computing device, and wherein the amplifier is configured to receive the audio signal comprising the raw audio signal and the supplementary audio signal.

3. The portable speaker system of claim 2, wherein the supplementary audio connection comprises a wireless audio connection.

4. The portable speaker system of claim 1, wherein the portable speaker system further comprises a supplementary audio connection configured to be coupled to the amplifier and a portable computing device, the supplementary audio connection for forwarding the raw audio signal to the portable computing device for processing, and for receiving the processed raw audio signal from the portable computing device, and wherein the audio signal comprises the processed raw audio signal.

5. The portable speaker system of claim 4, wherein the portable speaker system further comprises an electrical bypass for selectively providing one of the raw audio signal and the processed raw audio signal to the amplifier.

6. The portable speaker system of claim 4, further comprising a mounting mechanism attached to the housing of the portable speaker system, the mounting mechanism including a holder for retaining the portable computing device therein.

7. The portable speaker system of claim 6, wherein the mounting mechanism is detachable from the housing of the portable speaker system.

8. The portable speaker system of claim 6, wherein the mounting mechanism is integral with the stabilizer of the portable speaker system, and wherein the mounting mechanism extends along a portion of the body of the electric string instrument when the portable speaker system is attached to the electric string instrument.

9. The portable speaker system of claim 1, wherein the button connector is disposed on a bottom of the housing, the stabilizer is pivotally connected to the housing, the stabilizer is pivotable between an open position in which the stabilizer overlaps a portion of the body of the electric string instrument to inhibit rotation of the portable speaker system when the portable speaker system is attached to the electric string instrument, and a closed position in which the stabilizer is adjacent to the housing of the portable speaker system when the portable speaker system is not attached to the electric string instrument.

10. The portable speaker system of claim 9, wherein the stabilizer is elastically biased against the portion of the body of the electric string instrument when the portable speaker system is attached to the electric string instrument.

11. A portable speaker system for an electric string instrument, the system comprising:
  a portable computing device;
  a portable speaker system for the electric string instrument, the portable speaker system comprising:
    a housing comprising:
      an audio jack for receiving an audio plug, the audio plug providing a raw audio signal generated by the electric string instrument;
      an amplifier coupled to the audio jack and configured to receive an audio signal and amplify the audio signal to generate an amplified audio signal, the audio signal comprising one of the raw audio signal and a processed raw audio signal;
      a speaker coupled to the amplifier and configured to receive the amplified audio signal and generate output sound from the amplified audio signal; and
      a power supply coupled to the amplifier and speaker for powering the amplifier and speaker;
    an attachment mechanism for releasably attaching the portable speaker system to the electric string instrument and for inhibiting rotation of the portable speaker system when the portable speaker system is attached to the electric string instrument;
    a portable computing device mount extending from the housing of the portable speaker system for securing the portable computing device in fixed relation to the electric string instrument; and
    a supplementary audio connection configured to be coupled to the amplifier and the portable computing device, the supplementary audio connection configured to:
      forward the raw audio signal generated by the electric string instrument to the portable computing device for processing; and
      receive the processed raw audio signal from the portable computing device;
      wherein the processed raw audio signal is generated by the portable computing device by processing at least the raw audio signal generated by the electric string instrument.

12. The system of claim 11, wherein the attachment mechanism comprises:
  a button connector disposed on the housing for releasably attaching to a strap button of the electric string instrument to attach the portable speaker system to a body of the electric string instrument; and
  a stabilizer extending from the portable speaker system for inhibiting rotation of the portable speaker system when the portable speaker system is attached to the electric string instrument.

13. The system of claim 11, wherein the portable speaker system further comprises an electrical bypass for selectively providing one of the raw audio signal and the processed raw audio signal to the amplifier.

14. The system of claim 11, wherein the portable computing device mount is detachable from the housing of the portable speaker system.

15. The system of claim 11, wherein the supplementary audio connection comprises a wireless audio connection.

16. The system of claim 12, wherein the housing of the portable speaker system comprises a first side facing toward the strap button of the electric string instrument when the portable speaker system is attached to the electric string instrument, the button connector being disposed on the first side of the housing, the supporting member being pivotally connected to the housing, the supporting member being pivotable between an open position in which the supporting member overlaps a portion of the body of the electric string instrument to inhibit rotation of the portable speaker system when the portable speaker system is attached to the electric string instrument, and a closed position in which the supporting member is adjacent to the housing of the portable speaker system when the portable speaker system is not attached to the electric string instrument.

* * * * *